US012492465B2

(12) United States Patent
Hutchings et al.

(10) Patent No.: US 12,492,465 B2
(45) Date of Patent: Dec. 9, 2025

(54) PVD APPARATUS AND METHOD

(71) Applicant: SPTS Technologies Limited, Newport (GB)

(72) Inventors: Kyle Hutchings, Newport (GB); Tony Wilby, Newport (GB); Ian Moncrieff, Newport (GB); Rhonda Hyndman, Newport (GB); Stephen Burgess, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 18/752,780

(22) Filed: Jun. 24, 2024

(65) Prior Publication Data

US 2025/0207241 A1 Jun. 26, 2025

(30) Foreign Application Priority Data

Dec. 22, 2023 (GB) ..................................... 2319929

(51) Int. Cl.

*C23C 14/50* (2006.01)
*C23C 14/34* (2006.01)
*C23C 14/35* (2006.01)

(52) U.S. Cl.

CPC .......... *C23C 14/505* (2013.01); *C23C 14/345* (2013.01); *C23C 14/35* (2013.01)

(58) Field of Classification Search

None

See application file for complete search history.

(56) References Cited

U.S. PATENT DOCUMENTS

| | | | | |
|---|---|---|---|---|
| 7,426,900 | B2 | 9/2008 | Brcka | |
| 8,182,660 | B2 | 5/2012 | Miura et al. | |
| 8,377,270 | B2 * | 2/2013 | Tsunekawa | G11B 5/3903 204/298.23 |
| 10,490,434 | B2 | 11/2019 | Swaminathan et al. | |
| 2017/0125274 | A1 | 5/2017 | Swaminathan et al. | |
| 2021/0118706 | A1 | 4/2021 | Morita et al. | |
| 2022/0238314 | A1 * | 7/2022 | Yamagata | C23C 14/541 |

FOREIGN PATENT DOCUMENTS

JP H10116789 A 5/1998

OTHER PUBLICATIONS

UKIPO, Search Report issued in UK Patent Application No. 2319929.2, May 23, 2024.

EPO, Extended European Search Report issued in European Patent Application No. 24179109.4, Dec. 17, 2024.

* cited by examiner

*Primary Examiner* — Jason Berman

(74) *Attorney, Agent, or Firm* — Hodgson Russ LLP

(57) ABSTRACT

A Physical Vapour Deposition (PVD) apparatus having a PVD chamber, a target, a substrate support in the PVD chamber comprising an upper rotatable portion having an upper surface on which a substrate can be supported and a lower stationary portion, an RF source configured to supply an RF signal having an RF power to the lower stationary portion, and an arrangement for rotating the upper rotatable portion during a PVD process performed in the PVD chamber. The upper rotatable portion and the lower stationary portion are spaced apart so that the RF power supplied to the lower stationary portion is capacitively coupled to the upper rotatable portion.

22 Claims, 4 Drawing Sheets

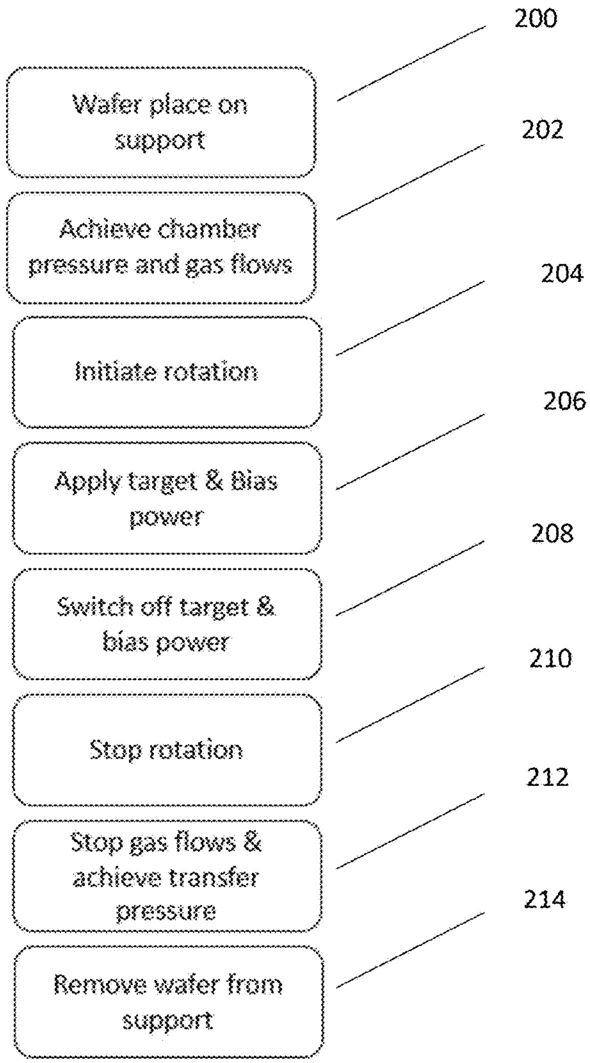
FIG. 2
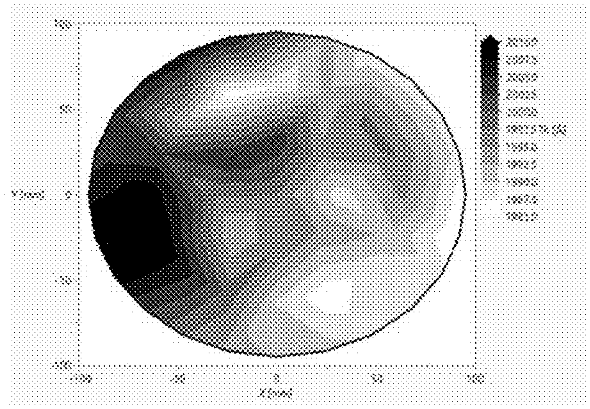
FIG. 3(a) Static deposition
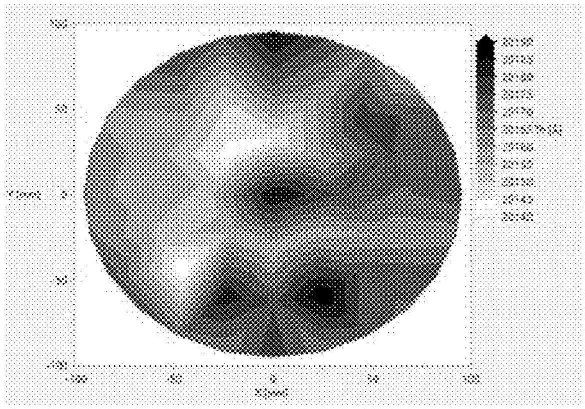
FIG. 3(b) Rotating platen top

PVD APPARATUS AND METHOD

CROSS REFERENCE TO RELATED APPLICATIONS

This application claims priority to United Kingdom Patent Application No. 2319929.2, filed on Dec. 22, 2023, the disclosure of which is incorporated herein by reference.

FIELD OF THE DISCLOSURE

This disclosure relates to a Physical Vapour Deposition (PVD) apparatus. Specifically, the present disclosure relates also to an associated method of performing PVD.

BACKGROUND OF THE DISCLOSURE

Physical Vapour Deposition (PVD) is widely used for the deposition of high purity thin films, both metals and dielectric, for use in microelectronics and related industries. A typical PVD process occurs at reduced pressure in the presence of an inert gas such as Ar in a vacuum chamber where a target material is sputtered onto a substrate by applying a potential difference between the target cathode and an anode. Positively charged Ar+ ions are attracted to the target and "sputter" material from the target. By positioning a substrate, such as a circular silicon wafer, in the vicinity of the target some of the sputtered material is deposited onto the substrate.

In the microelectronics industry, a PVD module is incorporated into an integrated platform where multiple steps can occur in a specific sequence. These platforms are commonly known as "cluster tools". Such platforms incorporate a number of modules around a central transport module where a vacuum robot can move substrates between the process modules. The process modules could comprise one or more PVD modules (potentially utilizing different targets) and/or could comprise pre-heat chambers, etch chambers and Chemical vapour deposition (CVD) chambers. Substrates are transported into and out of the transport module through load locks or vacuum cassette elevators. (VCEs).

It is necessary that the PVD module produces films to a fixed specification for the lifetime of the target and, when the target is changed, continues to meet the film specification. Properties that need to be controlled are film thickness, defectivity, stress, resistivity, texture or even composition of alloys. Ultimately the film specification will be device specific. Thin film thickness uniformity across a wafer, or within wafer (WIW), is one of the most critical metrics for a PVD system as unwanted variation in the thickness of a homogeneous film could result in undesirable device performance. Typically, this can be best represented by a % 1 sigma (or % 1σ) uniformity metric which is related to the standard deviation. This metric is often referred to as WIW non-uniformity and is expressed as a percentage. In an ideal case, the thickness of the deposited film would be equal at all points on the wafer surface (0% 1σ being ideal). Thickness measurements are conducted radially across the wafer surface such that 49-points are arranged with a centre point and three concentric rings equidistantly spaced. The thickness of the wafer is typically measured at each of the 49 points with each point representing an equal portion of the total area of the wafer less the 5 mm edge exclusion (EE) zone.

Prior art deposition technologies result in deposition WIW homogeneity deviations equal to or greater than 0.5% 1σ. This is due in part to factors such as the practical difficulty of designing a fully radially symmetric PVD chamber, constraints on overall chamber size and the accumulation of tolerances in key chamber components.

In PVD systems, wafers are typically placed upon a wafer support directly opposite a target assembly. Deposition uniformity is largely governed by: target width and magnetron design; the control of the distribution of material ejected from the target; and target to wafer separation which can produce collimation of the flux of ions arriving at the wafer surface. As target to wafer separation increases, uniformity improvements can be achieved but at the expense of a reduced deposition rate. In demanding multi-layer deposition sequences such as in MRAM, off-axis rotating wafer supports have been proposed to achieve improved uniformity for very thin films (i.e. films of several nm thickness). However, this results in large chambers with complex hardware and low deposition rates which are not suitable for more conventional PVD depositions. A further problem is that it is very difficult to achieve good RF coupling to a rotating part. Prior art systems utilizing a rotating wafer support are thus particularly problematic for those PVD processes that require an RF bias to be applied to a substrate support.

SUMMARY OF THE DISCLOSURE

What is required therefore is a new way to improve thickness uniformity in PVD depositions. It is desirable for this to be achieved without compromising deposition rates and changing the basic geometry of the PVD chamber. It is desirable for this to be achieved while maintaining effective and reliable substrate bias voltage. It is desirable for this to be achieved while maintaining effective and reliable temperature control. The present disclosure, in at least some of its embodiments, addresses the above-described problems, desires and requirements.

According to a first aspect of the disclosure there is provided a Physical Vapour Deposition (PVD) apparatus comprising:

a PVD chamber;

a target;

a substrate support in the chamber comprising an upper rotatable portion having an upper surface on which a substrate can be supported and a lower stationary portion;

an RF source configured to supply an RF signal having an RF power to the lower portion; and an arrangement for rotating the upper portion during a PVD process performed in the chamber;

wherein the upper and lower portions are spaced apart so that RF power supplied to the lower portion is capacitively coupled to the upper portion.

In this way, improved substrate thickness uniformity is achieved by rotation of the substrate on the upper portion while maintaining RF coupling with the static lower portion. Surprisingly, it has been found that excellent thermal coupling can be achieved as well, with the advantage that the temperature of the upper portion can be readily controlled. The substrate support can be implemented as a compact assembly structure which does not require any additional modification inside the chamber. This makes process implementation more efficient as it does not change process conditions within the chamber.

The upper and lower portions can be spaced apart with a gap of less than 3 mm. The upper and lower portions can be spaced apart with a gap in the range 0.5 to 1.5 mm. The gap can be varied in order to optimize the capacitive coupling of RF power.

The upper portion can be positioned on a plurality of non-conductive bearings, the bearings also being in contact with the lower portion. The bearings can be dielectric coated bearings, such as a dielectric coated steel bearings, or dielectric bearings, such as silicon nitride bearings.

The arrangement for rotating the upper portion can comprise a source of rotational motion. The source of rotational motion can be coupled to a rotatable shaft, the rotatable shaft being in driving connection with the upper portion.

The lower portion of the substrate support can comprise a platform portion which is spaced from the upper portion. The platform portion can be supported by a support stem. The rotatable shaft can extend through the support stem.

The lower portion can be electrically isolated from the chamber by a dielectric break structure.

The apparatus can further comprise an upper sheath which surrounds a periphery of the upper portion of the substrate support. The upper sheath can be in contact with the upper portion, at least during use in PVD. As a result, the upper sheath can be driven by RF power coupled to the upper portion during use in PVD.

The upper sheath can comprise an upper surface which is co-planar with the upper surface of the upper portion. In this way, a substrate can be supported by both the upper portion and the upper sheath. The upper surface can comprise an inner edge defining an annulus in which the upper surface of the upper portion is disposed.

The apparatus can further comprise a lower sheath which surrounds a periphery of the lower portion of the substrate support and is spaced therefrom. When the apparatus comprises a support stem, the lower sheath can surround a periphery of the platform portion and the support stem.

The lower sheath can be in electrical connection with the chamber.

The upper and lower sheaths can be spaced apart by a dark space gap. The dark space gap can be 2 mm or less. The dark space gap can be 1 mm or less.

The upper and lower sheaths can be formed from a metal, for example aluminium or stainless steel.

The lower portion of the substrate support can comprise one or both of resistive heater elements and fluid cooling conduits.

When the apparatus comprises a platform portion, the platform portion can house the resistive heater elements and fluid cooling conduits.

The target can be of any suitable type. The target can be formed from a metal. The use of an RF bias to the substrate support during PVD of metals is extremely important, and therefore the excellent control of RF bias provided by the disclosure is particularly advantageous in these applications.

The target can be sputtered by any suitable technique, such as DC sputtering, pulsed DC sputtering or RF sputtering. The target can comprise a magnetron, as is well known in the art.

The apparatus can further comprise a controller. The controller can control the process parameters during PVD. The controller can be configured to control the apparatus to perform the method of the second aspect of the present disclosure.

According to a second aspect of the present disclosure there is provided a method of performing PVD comprising the steps of:

- placing a substrate on a substrate support in a PVD chamber, the substrate support comprising an upper rotatable portion having an upper surface on which the substrate can be supported and a lower stationary portion;
- supplying an RF signal having an RF power to the lower portion;
- performing a PVD process to deposit a material on to the substrate by sputtering a target while the upper portion is rotated and the lower portion is stationary, wherein RF power supplied to the lower portion is capacitively coupled to the upper portion.

The upper portion can be rotated at a speed in the range 1 to 10 rpm.

The target can overlay and extend radially beyond the substrate support.

The temperature of the upper portion can be controlled by controlling the temperature of the lower portion.

When the substrate support comprises an upper sheath and the upper sheath comprises an upper surface comprising an inner edge defining an annulus in which the upper surface of the upper portion is disposed, the substrate can extend radially beyond the inner edge.

The substrate can be a semiconductor substrate such as a silicon substrate. The semiconductor substrate can be a silicon wafer, or a wafer of another semiconductor material.

For the avoidance of doubt, whenever reference is made herein to 'comprising' or 'including' and like terms, the present disclosure is also understood to include more limiting terms such as 'consisting' and 'consisting essentially'.

Whilst the present disclosure has been described above, it extends to any inventive combination of the features set out above, or in the following description, drawings or claims. For the avoidance of doubt, any features disclosed in relation to the first aspect of the present disclosure may be combined with any features disclosed in relation to the second aspect of the present disclosure and vice versa as appropriate.

BRIEF DESCRIPTION OF THE FIGURES

Embodiments of the present disclosure will now be described, by way of example only, with reference to the accompanying drawings, in which:

FIG. 2 shows a process sequence.

FIG. 3 shows thickness maps for (a) a deposition carried out using a prior art stationary platen and (b) a deposition carried out using the rotating substrate support of the present disclosure.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

Ranges of values are disclosed herein. The ranges set out a lower limit value and an upper limit value. Unless otherwise stated, the ranges include all values to the magnitude of the smallest value (either lower limit value or upper limit value) and ranges between the values of the stated range.

The steps of the method described in the various embodiments and examples disclosed herein are sufficient to carry out the methods of the present disclosure. Thus, in an embodiment, the method consists essentially of a combination of the steps of the methods disclosed herein. In another embodiment, the method consists of such steps.

Figure 1:
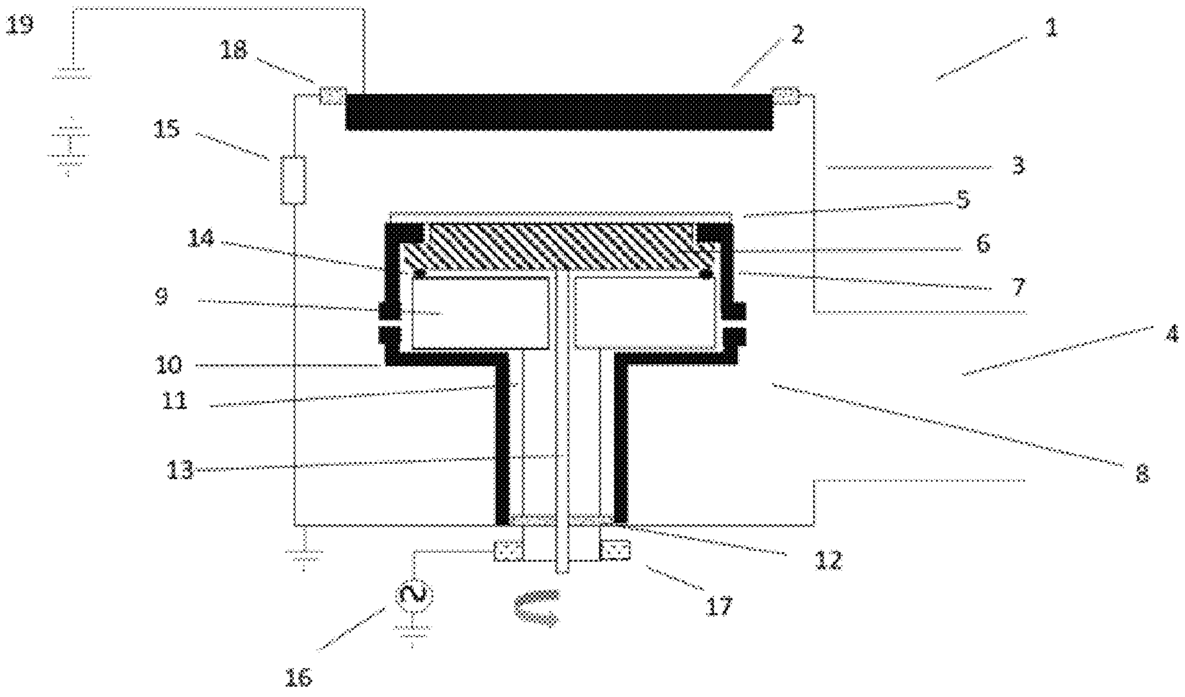
FIG. 1 is a semi-schematic cross-sectional view through a PVD deposition apparatus of the present disclosure.

FIG. 1 shows a PVD apparatus of the disclosure 1 comprising a sputtering target 2 within a metallic grounded vacuum chamber 3. The vacuum chamber 3 is pumped through vacuum port 4. A substrate 5, typically a wafer, to be processed is placed centrally on a substrate support 8. More specifically, the wafer is placed on an upper surface of an upper, rotatable, portion 6 of a substrate support 8. For processing wafer substrates, the upper portion can be in the form of a platen or a like structure. The substrate support 8 further comprises a lower, stationary, portion 9, 11 and a series of bearings 14 which are situated on top of the lower portion 9, 11. The upper portion 6 rests on the bearings 14 which serve to space the upper portion 6 from the lower portion 9, 11. The bearings 14 are non-conductive, such as dielectric coated steel bearings or dielectric bearings formed from a suitable material as silicon nitride. The bearings 14 can be located in any convenient position such as towards the perimeter of the lower portion 9, 11 or near its center or a combination of both. There is no direct contact between the lower surface of the upper portion 6 and the upper surface of the lower portion 9, 11 except through the bearings 14. This defines a gap of about 1 mm between the lower surface of the upper portion 6 and the upper surface of the lower portion 9, 11.

The lower portion is formed of a platform portion 9 located on a support stem 11. Resistive heaters, fluid cooling pathways and thermal monitoring equipment such as thermocouples are located in the stationary platform portion 9. A shaft 13 passes through an internal passage in the lower portion 9, 11 without contacting the lower portion. The shaft 13 is in contact with the upper portion. In use, the shaft 13 is rotated by a suitable source of rotational motion located outside the vacuum chamber 3 (not shown), such as a motor or an actuator, thereby causing the upper portion 6 with the substrate 5 positioned on it to rotate. Vacuum sealing for the rotating shaft 13 is achieved by using "O" ring seals between the shaft 13 and the internal passage in the lower portion 9, 11.

The substrate support 8 is located centrally with respect to the target at the base of the vacuum chamber 3 with a ceramic break 12 electrically isolating the substrate support 8 from the vacuum chamber 3. An RF signal having an RF power is applied to the lower portion 9,11 using an RF generator 16. The RF generator 16 is connected to an annular connection 17 which is attached to the support stem 11. An RF matching box (not shown) is also provided. RF power is thereby applied to the lower portion 9 which is capacitively coupled to the upper portion 6 to provide a DC bias on the substrate 5. The DC bias increases ion bombardment at the wafer surface from the plasma produced during sputtering to control film properties such as WIW thickness non-uniformity, stress and specific resistivity.

The substrate support 8 comprises the rotatable upper portion 6, the shaft 13 which causes the upper portion to rotate, the lower portion 9 and the support stem 11. The upper portion 6, lower portion 9 and the support stem 11 are all formed from a suitable metal such as stainless steel. In principle, the support stem does not need to be formed from a conductive material, but using a metal to manufacture the support stem is advantageous as it is easier to match the coefficients of thermal expansion of the support stem and the upper portion so that the substrate support functions effectively under the high temperatures encountered during PVD.

The apparatus further comprises an upper sheath 7 and a lower sheath 10. The upper sheath can be an annular upper platen cover 7 which rests on the perimeter of the upper portion 6 with its upper surface being coplanar with the upper surface of the upper portion 6 so that, in use, the substrate 5 can also be supported on the upper sheath 7. The lower sheath 10 can be a tubular structure surrounding but spaced apart from the support stem 11 and the base of the lower portion 9. The lower sheath 10 is connected to the chamber 3 ground while the upper sheath is electrically floating. The upper sheath 7 is separated from the lower sheath 10 by a dark space gap. The dark space gap is typically less than 1 mm under typical operating conditions as, with RF applied to the substrate support, a plasma discharge could occur between the RF live upper sheath 7 and the grounded lower sheath 10. Both upper and lower sheaths 7, 10 are metallic, for example aluminium or stainless steel. The sheaths 7, 10 can be textured to retain the PVD film and minimize the generation of particulates.

The substrate 5 enters/leaves the chamber through isolation valve 15 and is raised and lowered onto the substrate support 8 by a conventional lift assembly (not shown) either located near the perimeter of the wafer or more centrally within the wafer support. When situated on the substrate support the wafer extends beyond the internal edge of the upper sheath 7, typically by several mm (1-4 mm). The gap between the internal edge of the upper sheath 7 and the upper portion 6 is sized to maintain a small gap of about 0.5 mm to facilitate removal of the shielding, taking into account the thermal expansion of the materials used at the elevated temperatures encountered during processing.

In FIG. 1, a DC power supply 19 is shown connected to the target 2. However, the PVD process used can be any desired process, such as DC sputtering, pulsed DC sputtering with a magnetron assembly or RF sputtering. The target 2 extends beyond the diameter of the substrate 5 to improve film uniformity and is isolated from the grounded chamber 3 by an annular ceramic break 18. In tests with 200 mm diameter wafers, a 332 mm diameter target was used to improve film uniformity.

A typical process sequence is shown in FIG. 2. The process sequence assumes that the target has already been conditioned. At 200 wafer is placed onto lift pins in the process chamber. This can be achieved for example in a cluster tool using a vacuum transfer robot. The wafer is then lowered onto the platen top. The desired process conditions, pressure gas flow and temperature are then established at 202 before wafer rotation is initiated at 204. In rapid succession target power and substrate bias are applied at 206 and PVD commences. When the desired thickness has been achieved the target and bias power are switched off at 208 and rotation is stopped at 210. Chamber transfer pressure is achieved by stopping gas flow into the chamber and pumping to the desired pressure (step 212). When the transfer pressure is achieved a slot valve opens, the wafer is raised from the platen top by lift pins and is removed from the chamber by the vacuum robot at 214. The rotational speed of platen rotation can be controlled automatically using a controller which employs a software algorithm to ensure a whole number of rotations during the deposition process, thus ensuring a fully optimized result. Typical rotational speeds are 1-10 rpm. If required, the alignment of recesses in the rotating platen top with lift pin positions is also controlled automatically through the controller and the control software.

Experimental Results

Tests were performed using a Sigma fxP™ PVD system (SPTS Technologies Limited, Newport, UK) configured to process 200 mm diameter wafers. Deposition tests were carried out to quantify the differences in thickness uniformity and resistivity for metal deposition, in this case molybdenum (Mo), using a conventional platen assembly and a rotating platen assembly of the present disclosure. A rotating substrate support of the type shown in FIG. 1 was used. The rotating platen top and platen top shielding were made of stainless steel. Target to wafer separation and target size and magnetron configuration were unchanged during the experiments. A standard rotating magnetron was used during depositions. The nominal target thickness deposited was 2000 Å onto 200 mm silicon wafers. The deposition conditions were: DC target power 1 kW, pressure 13 mT, 300 W RF bias, deposition temperature 200° C. The platen top was rotated at 3 rpm. Thickness measurements were acquired using a MetaPULSE-G instrument (Onto Innovation), which is a non-destructive pump-probe picosecond laser acoustic technique suitable for thickness measurements of opaque metal films.

FIG. 3 shows thickness maps (49-point polar plots, 200 mm, 5 mm EE) for (a) a deposition carried out using a prior art stationary platen and (b) a deposition carried out using the rotating substrate support of the disclosure. Thickness non-uniformity % (1σ) and thickness range are reported in Table 1. For the same deposition process and duration there is a significant improvement in thickness NU % and range with the rotating substrate support of the disclosure. This suggests that the non-radial uniformity observed with the stationary platen deposition can be reduced without a reduction in deposition rate or productivity.

TABLE 1

Thickness Non uniformity and Thickness range for static and rotating deposition.

| Platen | Th NU % 1σ | Th Range Å |
|---|---|---|
| Static | 0.4 | 25 |
| Rotation | 0.05 | 5 |

Figure 4:
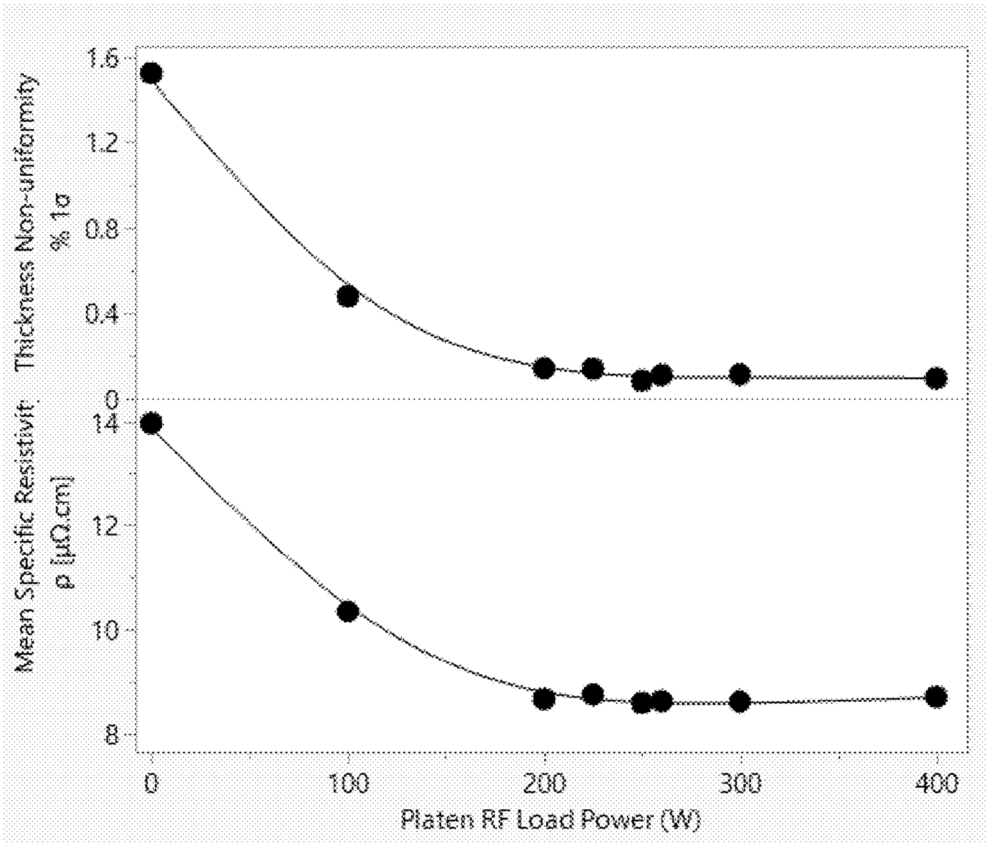
FIG. 4 shows applied platen RF power vs thickness non-uniformity (% 1 sigma) and mean specific resistivity for molybdenum deposited thin film metal layers.

The efficacy of the RF bias capability of the rotating substrate support can be seen in FIG. 4, which shows the influence of platen RF power vs thickness non-uniformity (% 1sigma) and mean specific resistivity for molybdenum thin film metal layers deposited using the rotating substrate support. Increasing platen RF power significantly assists in reducing thickness non-uniformity to less than or equal to 0.1% 1σ and mean specific resistivity to 8.6 μΩ·cm (best result: 0.05% 1 s at 250 W; ρ=8.6 μΩ·cm). Sheet resistance measurements were carried out using a Resmap® four-point probe technique (Creative Design Engineering, Inc., Cupertino, CA, USA).

Figure 5:
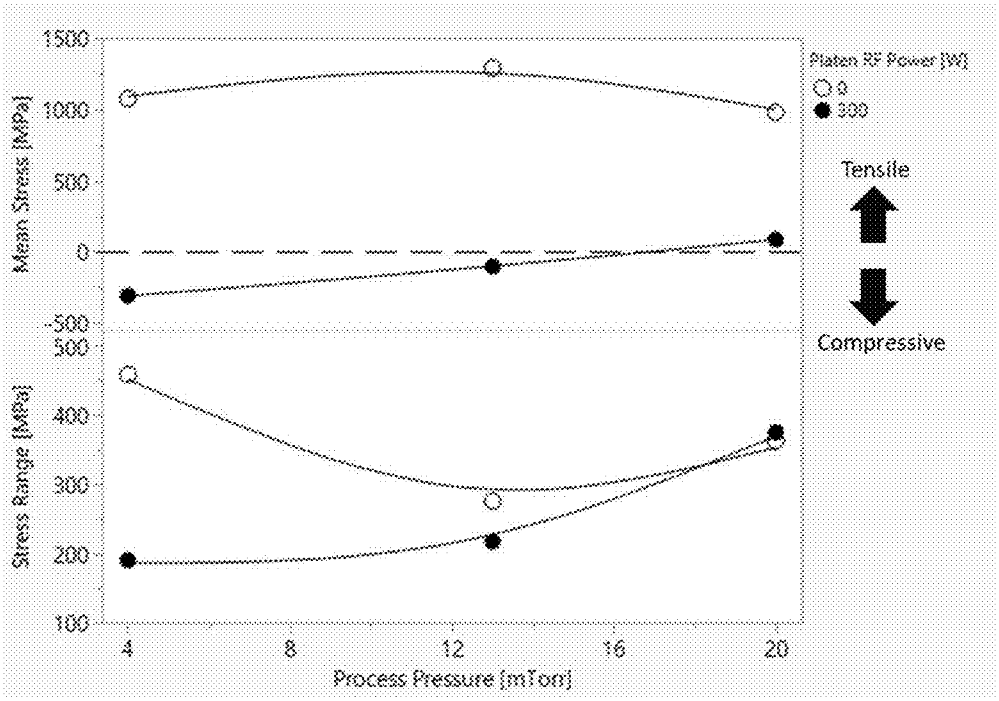
FIG. 5 shows mean local stress and full stress range in MPa as a function of process pressure (mTorr) vs Platen RF Power applied (0 W vs 300 W) for molybdenum deposition.

FIG. 5 shows the change in mean local stress and full stress range, measured using an FSM 128L (Frontier Semiconductor) stress mapping system, across a wide process pressure range. More specifically, FIG. 5 shows a comparison of mean local stress and full stress range data (measured in MPa) as a function of process pressure (mTorr) vs Platen RF Power applied (0 W vs 300 W). Molybdenum deposition was performed using 1 kW target power, a pressure of 13 mT and 10 mm EE. Effective stress control of the Mo film can be achieved to the extent that it is possible to fine-tune the stress by adjusting the process pressure. The mean stress can transition from compressive to tensile as pressure increases.

Figure 6:
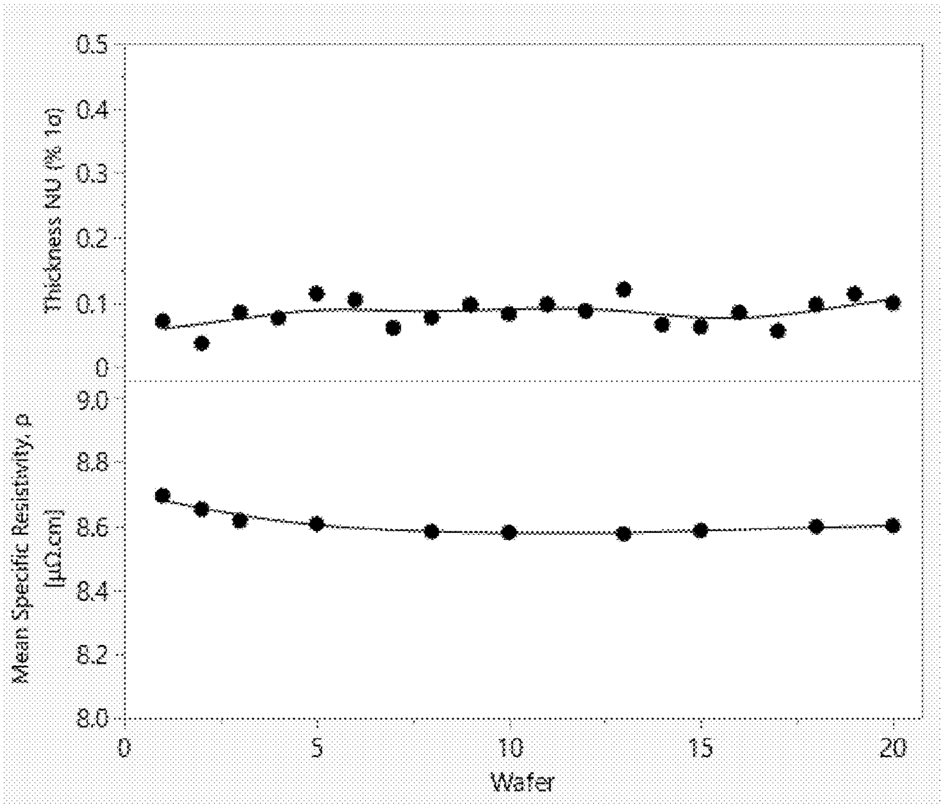
FIG. 6 shows thickness non-uniformity (% 1σ) and mean specific resistivity, ρ (μΩ·cm) repeatability over a 20 wafer processing run.

Wafer to wafer (WTW) repeatability is also critical in HVM. Uniformity, both within wafer and wafer-to-wafer, is important in all production environments. FIG. 6 shows wafer to wafer (WTW) repeatability for a 20 wafer run. Thickness non-uniformity (% 1σ) and mean specific resistivity, ρ (μΩ·cm) are shown. There is a 5 mm EE. Excellent thickness non-uniformity and mean specific resistivity repeatability are observed.

Figure 7:
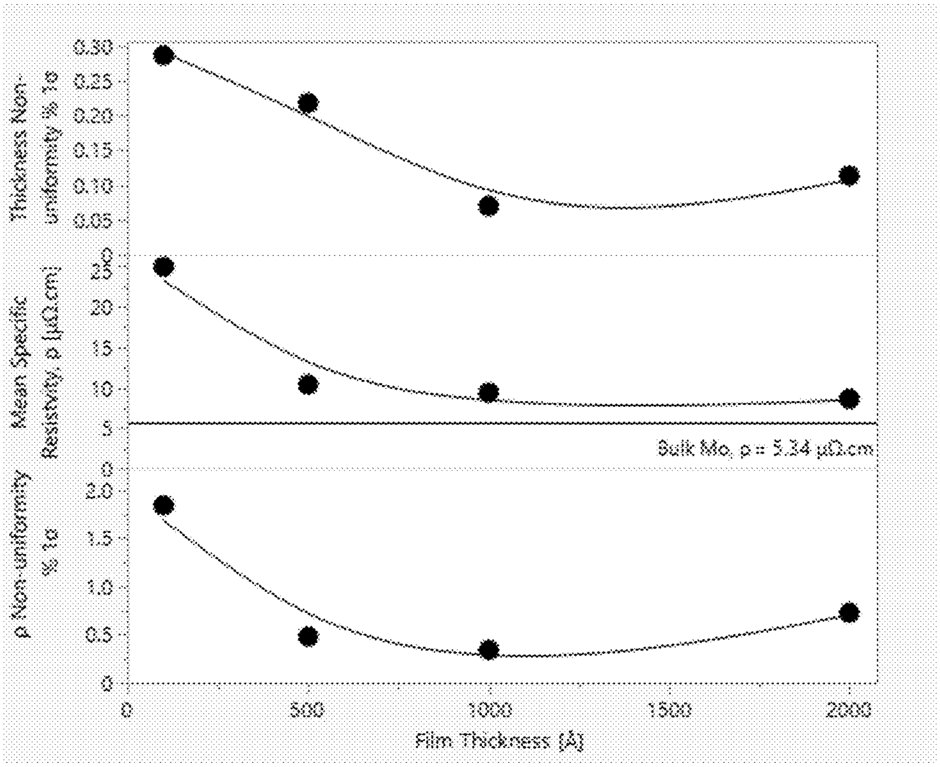
FIG. 7 shows thickness non-uniformity (% 10), mean specific resistivity and mean specific resistivity non-uniformity (% 1 s) as a function of molybdenum film thickness.

FIG. 7 illustrates the impact of molybdenum film thickness on thickness non-uniformity (% 1σ), mean specific resistivity and resistivity non-uniformity (% 1 s). For comparison, bulk specific resistivity of molybdenum is ca. 5.4 μΩ·cm. Measurements were made on Mo films of 100, 500, 1000 and 2000 Å thickness. For reduced thickness of less than 500 Å, the mean resistivity increases substantially. This is as expected for polycrystalline films, as scattering effects due to roughness and grain boundaries are dominant as the thickness approaches the mean free path of the conducting metal which is in the order of tens of nanometres.

The present disclosure enables reliable independent control of the wafer bias voltage over a wide range of power and rotation speeds through capacitive coupling of RF from the stationary part of the substrate support to the rotating part. The close proximity of the upper portion to the lower portion also provides accurate temperature control of the wafer. This avoids the complications and concerns over reliability associated with rotation of the entire substrate support.

Although the present disclosure has been described with respect to one or more particular embodiments and/or examples, it will be understood that other embodiments and/or examples of the present disclosure may be made without departing from the scope of the present disclosure.

The invention claimed is:

1. A Physical Vapour Deposition (PVD) apparatus comprising:

a PVD chamber;

a target;

a substrate support in the PVD chamber comprising an upper rotatable portion having an upper surface on which a substrate can be supported and a lower stationary portion;

an RF source configured to supply an RF signal having an RF power to the lower stationary portion; and an arrangement for rotating the upper rotatable portion during a PVD process performed in the PVD chamber;

wherein the upper rotatable portion and the lower stationary portion are spaced apart so that the RF power supplied to the lower stationary portion is capacitively coupled to the upper rotatable portion.

2. The PVD apparatus according to claim 1, wherein the upper rotatable portion and the lower stationary portion are spaced apart with a gap of less than 3 mm.

3. The PVD apparatus according to claim 2, wherein the upper rotatable portion and the lower stationary portion are spaced apart with a gap in a range from 0.5 to 1.5 mm.

4. The PVD apparatus according to claim 1, wherein the upper rotatable portion is positioned on a plurality of non-conductive bearings, the plurality of non-conductive bearings also being in contact with the lower stationary portion.

5. The PVD apparatus according to claim 1, wherein the arrangement for rotating the upper rotatable portion comprises a source of rotational motion coupled to a rotatable shaft, the rotatable shaft being in driving connection with the upper rotatable portion.

6. The PVD apparatus according to claim 5, wherein the lower stationary portion of the substrate support comprises a platform portion which is spaced from the upper rotatable portion.

7. The PVD apparatus according to claim 6, wherein the platform portion is supported by a support stem.

8. The PVD apparatus according to claim 7, wherein the rotatable shaft extends through the support stem.

9. The PVD apparatus according to claim 1, wherein the lower stationary portion is electrically isolated from the PVD chamber by a dielectric break structure.

10. The PVD apparatus according to claim 7, further comprising an upper sheath which surrounds a periphery of the upper rotatable portion of the substrate support.

11. The PVD apparatus according to claim 10, wherein the upper sheath is in contact with the upper rotatable portion.

12. The PVD apparatus according to claim 10, wherein the upper sheath comprises an upper surface which is co-planar with the upper surface of the upper rotatable portion so that the substrate can be supported by both the upper rotatable portion and the upper sheath.

13. The PVD apparatus according to claim 10, further comprising a lower sheath which surrounds a periphery of the lower stationary portion of the substrate support and is spaced therefrom.

14. The PVD apparatus according to claim 13, wherein the lower sheath surrounds a periphery of the platform portion and the support stem.

15. The PVD apparatus according to claim 13, wherein the lower sheath is in electrical connection with the PVD chamber.

16. The PVD apparatus according to claim 13, wherein the upper sheath and the lower sheath are spaced apart by a dark space gap.

17. The PVD apparatus according to claim 6, wherein the lower stationary portion of the substrate support comprises one or both of resistive heater elements and fluid cooling conduits.

18. The PVD apparatus according to claim 17, wherein the platform portion houses the resistive heater elements and the fluid cooling conduits.

19. A method of performing PVD comprising:

placing a substrate on a substrate support in a PVD chamber, the substrate support comprising an upper rotatable portion having an upper surface on which the substrate can be supported and a lower stationary portion;

supplying an RF signal having an RF power to the lower stationary portion; and performing a PVD process to deposit a material on to the substrate by sputtering a target while the upper rotatable portion is rotated and the lower stationary portion is stationary, wherein the RF power supplied to the lower stationary portion is capacitively coupled to the upper rotatable portion.

20. The method according to claim 19, wherein the upper rotatable portion is rotated at a speed in a range from 1 to 10 rpm.

21. The method according to claim 19, wherein the target overlays and extends radially beyond the substrate.

22. The method according to claim 19, wherein a temperature of the upper rotatable portion is controlled by controlling a temperature of the lower stationary portion.

* * * * *